(12) United States Patent
Ramakrishnan et al.

(10) Patent No.: US 11,486,981 B2
(45) Date of Patent: Nov. 1, 2022

(54) LIGHT DETECTION AND RANGING RECEIVER WITH AVALANCHE PHOTODIODES

(71) Applicant: Lumentum Operations LLC, San Jose, CA (US)

(72) Inventors: Srikanth Ramakrishnan, Ottawa (CA); Jimmy Zheng, Santa Clara, CA (US)

(73) Assignee: Lumentum Operations LLC, San Jose, CA (US)

( * ) Notice: Subject to any disclaimer, the term of this patent is extended or adjusted under 35 U.S.C. 154(b) by 444 days.

(21) Appl. No.: 16/787,604

(22) Filed: Feb. 11, 2020

(65) Prior Publication Data

US 2021/0063544 A1   Mar. 4, 2021

Related U.S. Application Data

(60) Provisional application No. 62/895,813, filed on Sep. 4, 2019.

(51) Int. Cl.
| | |
|---|---|
| *G01S 7/48* | (2006.01) |
| *G01S 7/4863* | (2020.01) |
| *G01S 7/484* | (2006.01) |
| *G01S 7/4913* | (2020.01) |
| *G01S 7/493* | (2006.01) |
| *H03M 1/12* | (2006.01) |

(52) U.S. Cl.
CPC ............ *G01S 7/4863* (2013.01); *G01S 7/484* (2013.01); *G01S 7/493* (2013.01); *G01S 7/4913* (2013.01); *H03M 1/126* (2013.01)

(58) Field of Classification Search
CPC ...... G01S 7/4863; G01S 7/484; G01S 7/4913; G01S 7/493; G01S 7/4816; G01S 17/42; H03M 1/126; H04B 10/60; H04B 10/66
See application file for complete search history.

(56) References Cited

U.S. PATENT DOCUMENTS

2020/0326563 A1 * 10/2020 Suess .................... G01S 7/4816
2021/0263198 A1 *  8/2021 Zhu ....................... G01S 17/894

* cited by examiner

*Primary Examiner* — Tony Ko
(74) *Attorney, Agent, or Firm* — Harrity & Harrity, LLP

(57) ABSTRACT

A light detection and ranging (lidar) receiver may include a first photodiode, a first amplifier connected to the first photodiode, and a first analog-to-digital converter (ADC) connected to an output of the first amplifier. The lidar receiver may include a second photodiode, a second amplifier connected to the second photodiode, and a second ADC connected to the second amplifier. The lidar may include a processor connected to an output of the first ADC and an output of the second ADC and a direct-current-to-direct-current converter connected to an output of the processor and to the first photodiode and the second photodiode. The processor may determine, based on the output of the first ADC and the output of the second ADC, a first bias to apply to the first photodiode and a second bias to apply to the second photodiode.

20 Claims, 4 Drawing Sheets

LIGHT DETECTION AND RANGING RECEIVER WITH AVALANCHE PHOTODIODES

RELATED APPLICATION

This application claims priority under 35 U.S.C. § 119 to U.S. Provisional Patent Application No. 62/895,813, filed on Sep. 4, 2019 and entitled "ACTIVE BALANCING FOR IMPROVED COMMON MODE REJECTION IN COHERENT RECEIVERS USING AVALANCHE PHOTODETECTOR AND LIDAR WITH SLOW AND FAST ANALOG-TO-DIGITAL CONVERTERS," the content of which is incorporated by reference herein in its entirety.

TECHNICAL FIELD

The present disclosure relates to light detection and ranging (lidar) systems and, more particularly, to a lidar receiver with avalanche photodiodes.

BACKGROUND

A measurement system may be used for depth-sensing measurements. For example, a lidar system may transmit pulses of laser light, and may measure reflected pulses to determine a distance of an object from the lidar system. In this case, the lidar system may perform a time-of-flight measurement of the laser pulse and may generate a three-dimensional representation of an object. A frequency-modulated continuous-wave (FMCW) lidar system may transmit continuous laser light according to a prescribed, continuous variation in frequency. In this case, the FMCW lidar system may determine a frequency difference between a received signal and a transmitted signal to generate a three-dimensional representation of an object.

SUMMARY

According to some implementations, a lidar system may include a transmitter to transmit an optical beam, and a receiver to receive a reflection of the optical beam, the receiver comprising: a first photodiode to generate a first analog signal that is based at least in part on the reflection of the optical beam; a first amplifier to obtain the first analog signal from the first photodiode; a first analog-to-digital converter (ADC) to derive a first digital signal based on the first analog signal; a second photodiode to generate a second analog signal that is based at least in part on the reflection of the optical beam; a second amplifier to obtain the second analog signal from the second photodiode; a second ADC to derive a second digital signal based on the second analog signal; a processor to determine, based on the first digital signal and the second digital signal, a first bias to apply to the first photodiode and a second bias to apply to the second photodiode, wherein, when the first bias is applied to the first photodiode and the second bias is applied to the second photodiode, a first current associated with the first analog signal corresponds to a second current associated with the second analog signal; and a direct-current-to-direct-current converter to apply the first bias to the first photodiode and to apply the second bias to the second photodiode.

According to some implementations, a lidar receiver may include a first photodiode; a first amplifier connected to the first photodiode; a first ADC connected to an output of the first amplifier; a second photodiode; a second amplifier connected to the second photodiode; a second ADC connected to an output of the second amplifier; a processor connected to an output of the first ADC and an output of the second ADC; and a direct-current-to-direct-current converter connected to an output of the processor and to the first photodiode and the second photodiode.

According to some implementations, a method may include generating, by a lidar receiver, using a first photodiode, and based at least in part on a reflection of an optical beam, a first analog signal; deriving, by the lidar receiver and based on the first analog signal, a first digital signal; generating, by the lidar receiver, using a second photodiode, and based at least in part on the reflection of the optical beam, a second analog signal; deriving, by the lidar receiver and based on the second analog signal, a second digital signal; and determining, by the lidar receiver and based on the first digital signal and the second digital signal, a first bias to apply to the first photodiode and a second bias to apply to the second photodiode, wherein, when the first bias is applied to the first photodiode and the second bias is applied to the second photodiode, a first current associated with the first analog signal corresponds to a second current associated with the second analog signal.

DETAILED DESCRIPTION

The following detailed description of example implementations refers to the accompanying drawings. The same reference numbers in different drawings may identify the same or similar elements.

A lidar system may use coherent detection to measure reflected pulses to determine a distance of an object from the lidar system. For example, the lidar system may include a lidar receiver including a pair of photodiodes to generate, based on reflected pulses, photocurrents which may be used to determine the distance of the object from the lidar system. A signal-to-noise ratio (SNR) in the photocurrents may impact performance of the lidar system, where higher SNRs may correspond to better performance than lower SNRs. The lidar system may include a laser (e.g., a laser diode) having a relative intensity noise (RIN), which may increase over time, due to temperature changes, and/or the like, and may reduce the SNR. Using coherent detection, the lidar receiver may use a common mode rejection ratio (CMRR) to cancel the RIN and increase the SNR.

Figure 1:
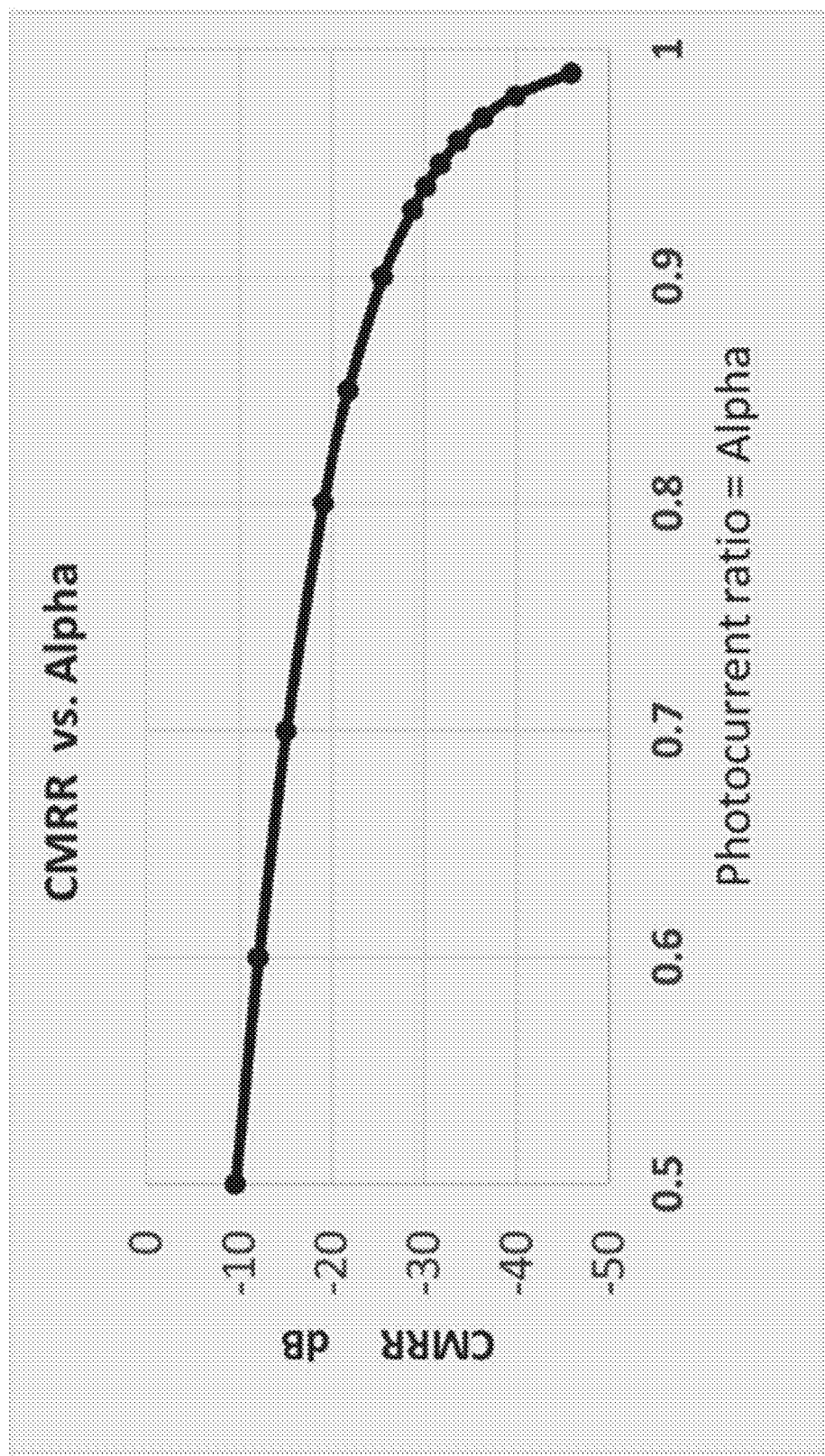
FIG. 1 is a diagram of an example implementation described herein.

FIG. 1 is a diagram of an example implementation 100 described herein. As shown in FIG. 1, the CMRR may be related to a photocurrent ratio (Alpha), where Alpha is a ratio of the photocurrents from the photodiodes in the pair of photodiodes of the lidar receiver. A CMRR having a more negative number may be referred to as a higher CMRR than another CMRR having a less negative number. In some implementations, a higher CMRR (e.g., a more negative number) may increase the SNR of the lidar receiver and improve performance of the lidar system (e.g., increase and/or maintain a maximum distance measurement and/or the like). As shown in FIG. 1, a lidar receiver with an Alpha near one may have a high CMRR. Thus, a lidar receiver may include photodiodes having balanced photocurrents to achieve an Alpha near one.

A lidar receiver may include a pair of p-i-n (PIN) photodiodes to generate, based on reflected pulses, photocurrents and a pair of feedback-controlled optical attenuators to attenuate the reflected pulses received by the PIN photodiodes to balance the photocurrents of the PIN photodiodes. However, lidar receivers including such optical attenuators may be expensive to manufacture and may suffer from high insertion loss.

Another lidar receiver may include a pair of PIN photodiodes to generate, based on reflected pulses, photocurrents and a transimpedance amplifier (TIA) for each of the PIN photodiodes. However, the two TIAs would generate twice as much thermal noise and even greater shot noise, thereby reducing the SNR. Additionally, or alternatively, characteristics of the TIAs may not change in a same manner as a temperature of the lidar system changes.

According to some implementations described herein, a lidar receiver may include a first photodiode (e.g., a first avalanche photodiode and/or the like) and a second photodiode (e.g., a second avalanche photodiode and/or the like), where the first photodiode and the second photodiode generate, based on a reflected optical beam, a first signal and a second signal, respectively. In some implementations, the lidar receiver may include a processor to determine, based on the first signal and the second signal, a first bias to apply to the first photodiode and a second bias to apply to the second photodiode, where, when the first bias is applied to the first photodiode and the second bias is applied to the second photodiode, a first current associated with the first analog signal corresponds to a second current associated with the second analog signal. In some implementations, the lidar receiver may include a direct-current-to-direct-current converter to apply the first bias to the first photodiode and to apply the second bias to the second photodiode. In this way, the lidar receiver may balance the first photocurrent and the second photocurrent to achieve an Alpha near one, a higher CMRR, an improved SNR, improved performance of a lidar system including the lidar receiver, and/or the like.

In some implementations, the first photodiode and/or the second photodiode may be avalanche photodiodes, which may be less expensive than using optical attenuators to balance photocurrents and may have lower insertion losses than when using optical attenuators. In some implementations, the lidar receiver may balance the first photocurrent and the second photocurrent without generating additional thermal noise, shot noise, and/or the like, which may be generated by TIAs.

In some implementations, a lidar system may include the lidar receiver and a laser. As the RIN of the laser changes over time, due to temperature changes, and/or the like, the lidar receiver may maintain balance of the first photocurrent and the second photocurrent, and may maintain performance of the lidar system.

Figure 2:
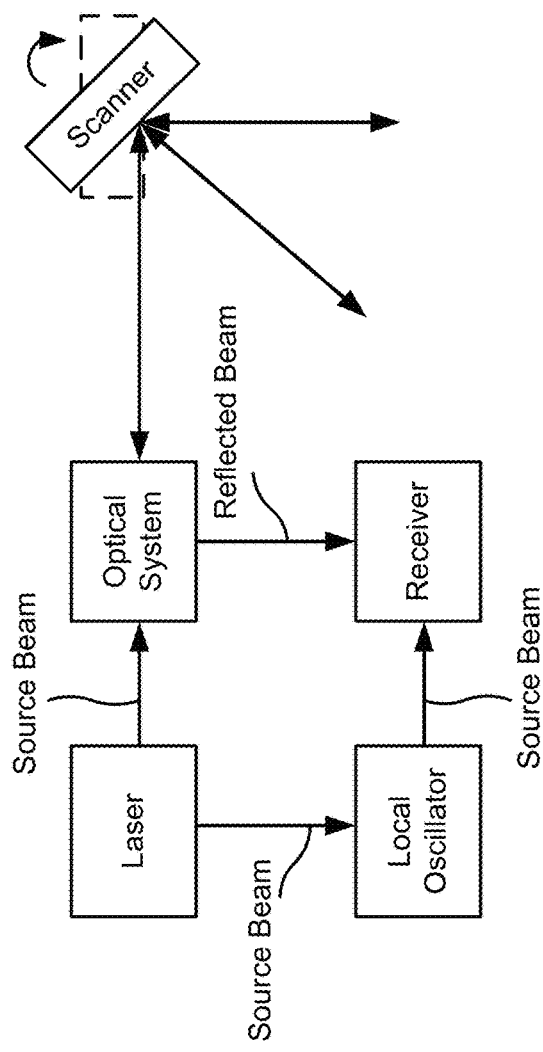
FIG. 2 is a diagram of an example lidar system described herein.

FIG. 2 is a diagram of an example lidar system 200 described herein. As shown in FIG. 2, the lidar system 200 may include a laser, an optical system, a scanner, a local oscillator, and a receiver. In some implementations, the laser may generate a source beam (e.g., a laser beam, an optical beam, and/or the like) and provide the source beam to the optical system, and the optical system may provide the source beam to the scanner. As shown in FIG. 2, the scanner may tilt angularly to scan the source beam across a field of view, and may receive a beam reflected from the field of view (e.g., reflected from an object in the field of view and/or the like). In some implementations, the scanner may provide the reflected beam to the optical system.

As shown in FIG. 2, the laser may also provide the source beam to the local oscillator, and the local oscillator may provide the source beam to the receiver. As also shown in FIG. 2, the optical system may provide the reflected beam to the receiver. The receiver may convert the source beam from the local oscillator and the reflected beam into an output signal (e.g., a digital output signal and/or the like). In some implementations, the lidar system 200 may include one or more processors, and the lidar system 200 may be configured to, using the one or more processors and based on the output signal, generate a digital representation of the field of view (e.g., a distance of an object from the lidar system and/or the like).

In some implementations, the lidar system may be a coherent lidar system, such as an FMCW lidar system. In some implementations, the lidar system (e.g., FMCW lidar system) may be associated with an autonomous machine, such as an autonomous vehicle. As indicated above, FIG. 2 is provided merely as an example. Other examples may differ from what is described with regard to FIG. 2.

Figure 3:
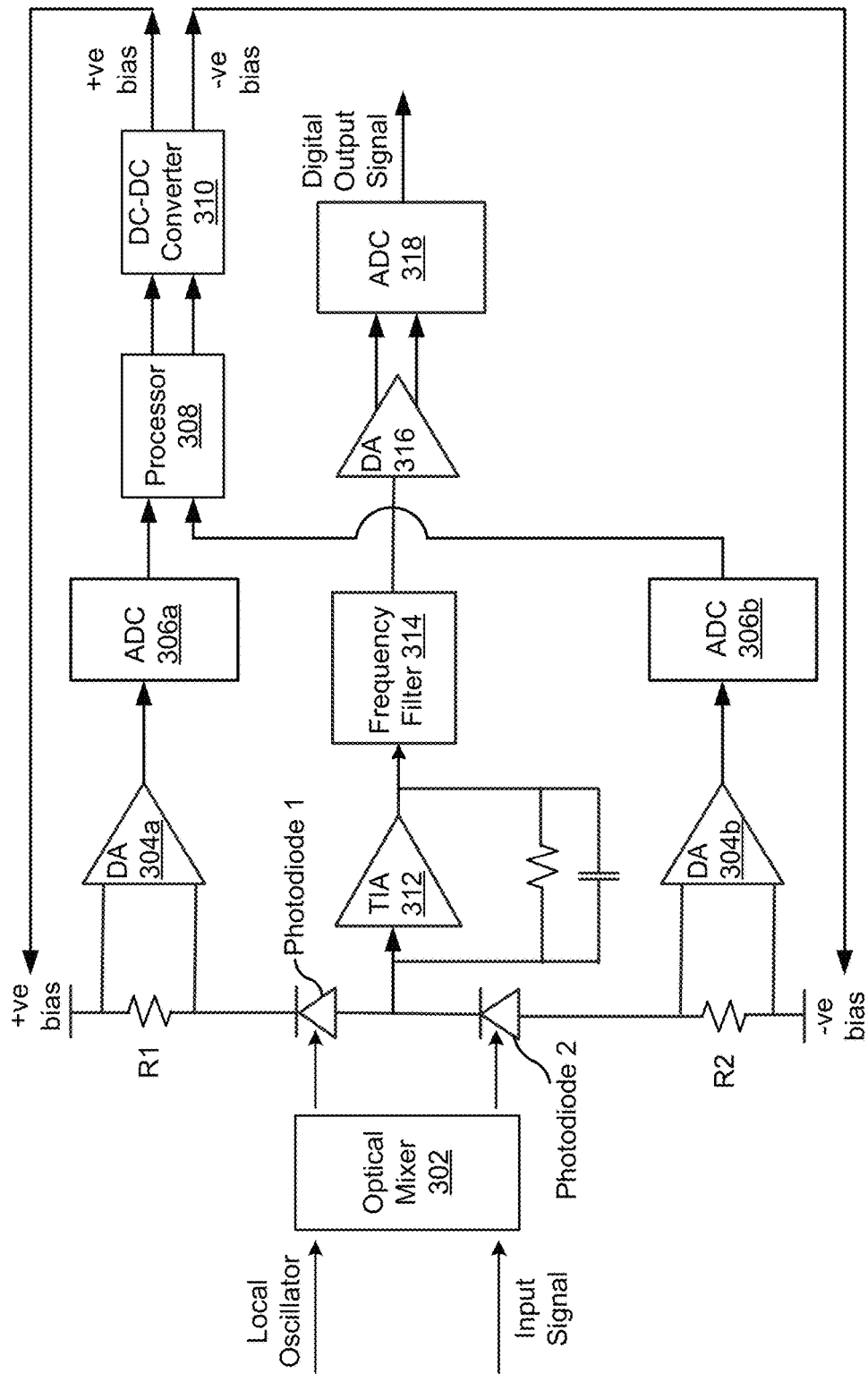
FIG. 3 is a diagram of an example lidar receiver described herein.

FIG. 3 is a diagram of an example lidar receiver 300 as described herein. In particular, FIG. 3 shows a circuit associated with the lidar receiver 300. In some implementations, a lidar system (e.g., the lidar system 200 of FIG. 2), a three-dimensional sensing system, and/or the like may include the lidar receiver 300 (e.g., as the receiver shown in FIG. 2.), a transmitter (e.g., the laser, the optical system, the scanner, and/or the like as shown in FIG. 2), and one or more processors. As shown in FIG. 3, the lidar receiver 300 may include photodiode 1, photodiode 2, a first resistor R1, a second resistor R2, an optical mixer 302, a first differential amplifier (DA) 304a, a second DA 304b, a first analog-to-digital converter (ADC) 306a, a second ADC 306b, a processor 308, a direct-current-to-direct-current (DC-DC) converter 310, a TIA 312, a frequency filter 314, a third DA 316, and a third ADC 318.

As shown in FIG. 3, the optical mixer 302 may receive an input signal associated with a reflection of an optical beam transmitted by the transmitter of the lidar system. In some implementations, such as in FMCW lidar, the optical mixer 302 may also receive a signal associated with a local oscillator of the lidar system. The optical mixer 302 may output a signal associated with a difference (e.g., a heterodyne measurement) of the input signal and the signal associated with the local oscillator to photodiode 1 and photodiode 2, and photodiode 1 and photodiode 2 may generate, based on the signal associated with the difference, a first photocurrent and a second photocurrent, respectively.

In some implementations, photodiode 1 and/or photodiode 2 may be avalanche photodiodes. For example, photodiode 1 and photodiode 2 may be avalanche photodiodes having a gain of between 1 and 1.5 (e.g., 1.1, 1.3, and/or the like).

As shown in FIG. 3, the first resistor R1, the first DA 304a, and the first ADC 306a may be associated with photodiode 1. For example, the first DA 304a may be connected to photodiode 1 via the first resistor R1, and may obtain a first analog signal based on the first photocurrent from the photodiode 1. The first DA 304a may improve the first analog signal prior to processing by the first ADC 306a. The first ADC 306a may be connected to an output of the first DA 304a, and may derive a first digital signal based on the first analog signal. For example, the first ADC 306a may be configured to convert the first analog signal to the first digital signal for use by the processor 308.

Similarly, and as also shown in FIG. 3, the second resistor R2, the second DA 304b, and the second ADC 306b may be associated with photodiode 2. For example, the second DA 304b may be connected to photodiode 2 via the second resistor R2, and may obtain a second analog signal based on the second photocurrent from the photodiode 2. The second DA 304b may improve the second analog signal prior to processing by the second ADC 306b. The second ADC 306b may be connected to an output of the second DA 304b, and may derive a second digital signal based on the second analog signal. For example, the second ADC 306b may be configured to convert the second analog signal to the second digital signal for use by the processor 308.

In some implementations, the first DA 304a and/or the second DA 304b may be a low speed amplifier. For example, the first DA 304a and/or the second DA 304b may operate at a frequency of 1 kHz or less (e.g., 900 Hz, 500 Hz, 300 Hz, 100 Hz, 50 Hz, 30 Hz, and/or the like).

As shown in FIG. 3, the processor 308 may be connected to an output of the first ADC 306a and an output of the second ADC 306b. In some implementations, the processor 308 may be configured to determine, based on the first digital signal and the second digital signal, a first bias to apply to photodiode 1 and a second bias to apply to photodiode 2. For example, the processor 308 may be configured to determine the first bias and the second bias such that, when the first bias is applied to photodiode 1 and the second bias is applied to photodiode 2, the first photocurrent corresponds to the second photocurrent. In some implementations, the first photocurrent may correspond to the second photocurrent when a ratio of the first photocurrent to the second photocurrent satisfies a threshold and/or when a ratio of the second photocurrent to the first photocurrent satisfies a threshold. For example, a ratio of between 0.9 and 1.1 may satisfy the threshold.

Additionally, or alternatively, the processor 308 may be configured to determine the first bias and the second bias such that, when the first bias is applied to photodiode 1 and the second bias is applied to photodiode 2, a ratio of the first photocurrent to the second photocurrent satisfies a threshold. For example, a ratio of between 0.9 and 1.1 may satisfy the threshold.

Additionally, or alternatively, the processor 308 may be configured to determine the first bias and the second bias such that, when the first bias is applied to photodiode 1 and the second bias is applied to photodiode 2, a ratio of the second photocurrent to the first photocurrent satisfies a threshold. For example, a ratio of between 0.9 and 1.1 may satisfy the threshold.

As shown in FIG. 3, the DC-DC converter 310 may be connected to an output of the processor and to photodiode 1 and photodiode 2. In some implementations, the DC-DC converter 310 may be configured to receive, from the processor 308, the first bias and the second bias. In some implementations, the DC-DC converter 310 may be configured to apply the first bias to photodiode 1 and apply the second bias to photodiode 2. For example, the DC-DC converter 310 may be configured to apply a positive bias corresponding to the first bias to photodiode 1 and apply a negative bias corresponding to the second bias to photodiode 2. By applying the first bias to photodiode 1 and applying the second bias to photodiode 2, the DC-DC converter 310 may balance the first photocurrent and the second photocurrent such that the first photocurrent corresponds to the second photocurrent.

As shown in FIG. 3, the TIA 312 may be connected to photodiode 1 and photodiode 2. In some implementations, the TIA 312 may convert a third photocurrent to an analog output signal (e.g., a voltage), where the third photocurrent may be a combination of the first photocurrent and the second photocurrent. In some implementations, the TIA 312 may output the analog output signal to the frequency filter 314.

As shown in FIG. 3, the frequency filter 314 may be connected to an output of the TIA 312. In some implementations, the frequency filter 314 may be configured to pass a particular range of frequencies of the analog output signal. For example, the frequency filter 314 may be a band-pass filter, a low-pass filter, and/or the like. In some implementations, the frequency filter 314 may be configured to output a filtered analog output signal to the third DA 316.

As shown in FIG. 3, the third DA 316 may be connected to an output of the frequency filter 314. In some implementations, the third DA 316 may receive, from the frequency filter 314, the filtered analog output signal, and the third DA 316 may be configured to improve the filtered analog output signal prior to processing by the third ADC 318. In some implementations, the third DA 316 may be a high speed amplifier. For example, the third DA 316 may operate at a frequency of 1 MHz or more (e.g., 10 MHz, 50 MHz, 100 MHz, 200 MHz, 300 Hz, 400 Hz, 500 MHz and/or the like). In some implementations, the third DA 316 may be configured to output the improved filtered analog output signal to the third ADC 318.

As shown in FIG. 3, the third ADC 318 may be connected to the third DA 316. In some implementations, the third ADC 318 may receive the improved filtered analog output signal from the third DA 316, and the third ADC 318 may be configured to convert the improved filtered analog output signal to a digital output signal.

In some implementations, the third ADC 318 may be configured to output the digital output signal to one or more processors (e.g., the processor 308, another processor, and/or the like). The one or more processors may generate, based on the digital output signal, a digital representation of one or more targets (e.g., in a field-of-view (FOV) of the lidar system). For example, the one or more processors may process the digital output signal with a fast Fourier transform (FFT) to generate the digital representation.

In this way, the lidar receiver 300 may balance the first photocurrent and the second photocurrent to achieve an Alpha near one, a higher CMRR, an improved SNR, improved performance of a lidar system including the lidar receiver, and/or the like. For example, by balancing the first photocurrent and the second photocurrent, the lidar receiver 300 may provide a higher quality digital output signal than may be provided without balancing the first photocurrent and the second photocurrent. Additionally, or alternatively, by providing a higher quality digital output signal, the lidar receiver 300 may conserve computing resources that would otherwise be consumed by performing additional processing on the digital output signal to generate the digital representation.

Additionally, or alternatively, the lidar receiver 300 may balance the first photocurrent and the second photocurrent (e.g., by adjusting the first bias and/or the second bias) as conditions of the lidar system change. For example, changes in temperature, pressure, humidity, and/or the like may affect components of the lidar system (e.g., the transmitter, an optical system, a scanner, and/or the like) such that the signal associated with the local oscillator and/or the input signal change and affect the first photocurrent and/or the second photocurrent. In some implementations, the lidar receiver 300 may actively balance, by adjusting the first bias and/or the second bias, the first photocurrent and the second photocurrent as the conditions change. In this way, the lidar receiver 300 may maintain performance of the lidar system as conditions change.

In some implementations, manufacturing of the lidar receiver 300 may not require screening tests to confirm that photodiode 1 and photodiode 2 provide balanced photocurrents (e.g., to confirm a higher CMRR and/or the like) because the lidar receiver 300 may actively balance the photodiode 1 and photodiode 2. Accordingly, the lidar receiver 300 may conserve computing resources and/or financial resources during the manufacturing process that would otherwise be consumed by performing screening tests on photodiode 1 and photodiode 2.

As indicated above, FIG. 3 is provided merely as an example. Other examples may differ from what is described with regard to FIG. 3.

Figure 4:
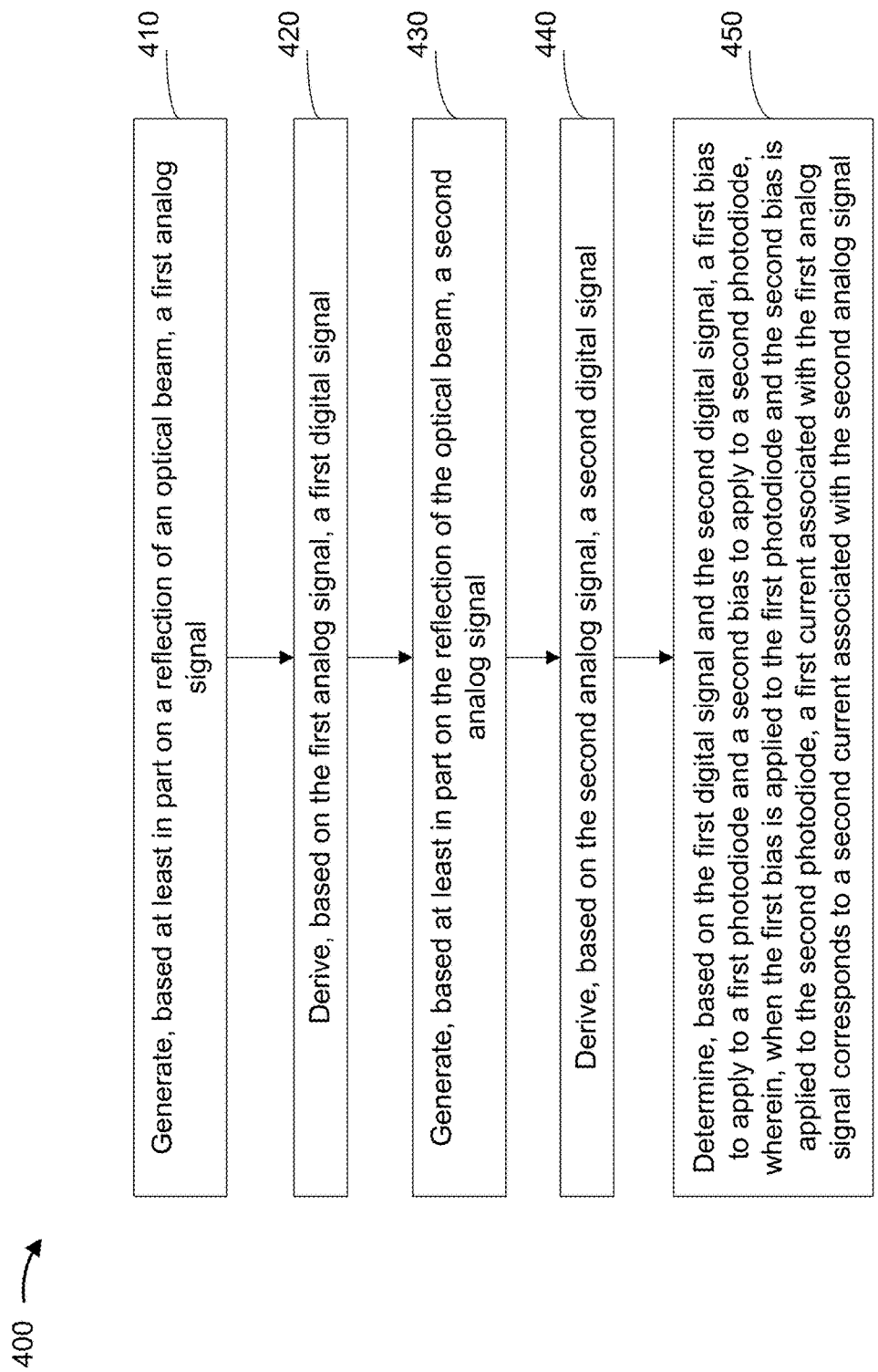
FIG. 4 is a flowchart of an example process for lidar detection.

FIG. 4 is a flow chart of an example process 400 for balancing photocurrents of photodiodes in a lidar receiver. In some implementations, one or more process blocks of FIG. 4 may be performed by a lidar receiver (e.g., lidar receiver 300). In some implementations, one or more process blocks of FIG. 4 may be performed by another device or a group of devices separate from or including the lidar receiver, such as a lidar system (e.g., lidar system 200), and/or the like.

As shown in FIG. 4, process 400 may include generating, based at least in part on a reflection of an optical beam, a first analog signal (block 410). For example, the lidar receiver (e.g., using photodiode 1, the resistor R1, the first DA 304*a*, and/or the like) may generate, based at least in part on a reflection of an optical beam, a first analog signal, as described above.

As further shown in FIG. 4, process 400 may include deriving, based on the first analog signal, a first digital signal (block 420). For example, the lidar receiver (e.g., using the first ADC 306*a* and/or the like) may derive, based on the first analog signal, a first digital signal, as described above.

As further shown in FIG. 4, process 400 may include generating, based at least in part on the reflection of the optical beam, a second analog signal (block 430). For example, the lidar receiver (e.g., using photodiode 2, the resistor R2, the second DA 304*b*, and/or the like) may generate, based at least in part on the reflection of the optical beam, a second analog signal, as described above.

As further shown in FIG. 4, process 400 may include deriving, based on the second analog signal, a second digital signal (block 440). For example, the lidar receiver (e.g., using the second ADC 306*b* and/or the like) may derive, based on the second analog signal, a second digital signal, as described above.

As further shown in FIG. 4, process 400 may include determining, based on the first digital signal and the second digital signal, a first bias to apply to a first photodiode and a second bias to apply to a second photodiode, wherein, when the first bias is applied to the first photodiode and the second bias is applied to the second photodiode, a first current associated with the first analog signal corresponds to a second current associated with the second analog signal (block 450). For example, the lidar receiver (e.g., using the processor 308 and/or the like) may determine, based on the first digital signal and the second digital signal, a first bias to apply to the first photodiode and a second bias to apply to the second photodiode, as described above. In some implementations, when the first bias is applied to the first photodiode and the second bias is applied to the second photodiode, a first current associated with the first analog signal corresponds to a second current associated with the second analog signal.

Process 400 may include additional implementations, such as any single implementation or any combination of implementations described below and/or in connection with one or more other processes described elsewhere herein.

In a first implementation, the first photodiode and the second photodiode are avalanche photodiodes.

In a second implementation, alone or in combination with the first implementation, the first bias, when applied to the first photodiode, adjusts a first gain of the first photodiode, and the second bias, when applied to the second photodiode, adjusts a second gain of the second photodiode.

In a third implementation, alone or in combination with one or more of the first and second implementations, process 400 includes applying the first bias to the first photodiode and applying the second bias to the second photodiode. For example, the lidar receiver (e.g., using the DC-DC converter 310 and/or the like) may apply the first bias to the first photodiode and apply the second bias to the second photodiode, as described above.

In a fourth implementation, alone or in combination with one or more of the first through third implementations, process 400 includes generating a photocurrent and converting the photocurrent to an output signal. For example, the lidar receiver (e.g., using photodiode 1, photodiode 2, and/or the like) may generate the photocurrent, and the lidar receiver (e.g., using the TIA 312, the frequency filter 314, the third DA 316, the third ADC 318, and/or the like) may convert the photocurrent to an output signal, as described above.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein, the term "component" is intended to be broadly construed as hardware, firmware, and/or a combination of hardware and software.

As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

It will be apparent that systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A light detection and ranging (lidar) system, comprising:
   a transmitter to transmit an optical beam; and
   a receiver to receive a reflection of the optical beam, the receiver comprising:
     a first photodiode to generate a first analog signal that is based at least in part on the reflection of the optical beam;
     a first amplifier to obtain the first analog signal from the first photodiode;
     a first analog-to-digital converter (ADC) to derive a first digital signal based on the first analog signal;
     a second photodiode to generate a second analog signal that is based at least in part on the reflection of the optical beam;
     a second amplifier to obtain the second analog signal from the second photodiode;
     a second ADC to derive a second digital signal based on the second analog signal;
     a processor to determine, based on the first digital signal and the second digital signal, a first bias to apply to the first photodiode and a second bias to apply to the second photodiode,
       wherein, when the first bias is applied to the first photodiode and the second bias is applied to the second photodiode, a first current associated with the first analog signal corresponds to a second current associated with the second analog signal; and
     a direct-current-to-direct-current converter to apply the first bias to the first photodiode and to apply the second bias to the second photodiode.

2. The lidar system of claim 1, wherein the first photodiode and the second photodiode are avalanche photodiodes.

3. The lidar system of claim 1, wherein at least one of the first amplifier or the second amplifier is a low speed amplifier.

4. The lidar system of claim 1, wherein the first bias, when applied to the first photodiode, adjusts a first gain of the first photodiode, and
   wherein the second bias, when applied to the second photodiode, adjusts a second gain of the second photodiode.

5. The lidar system of claim 1, further comprising:
   a transimpedance amplifier to convert a photocurrent to an analog output signal,
     wherein the first photodiode and the second photodiode are to generate the photocurrent; and
   a third ADC to convert the analog output signal to a digital output signal.

6. The lidar system of claim 1, wherein the transmitter comprises:
   a laser to generate the optical beam; and
   a scanner to scan a field of view with the optical beam and to receive the reflection of the optical beam.

7. A light detection and ranging (lidar) receiver, comprising:
   a first photodiode;
   a first amplifier connected to the first photodiode;
   a first analog-to-digital converter (ADC) connected to an output of the first amplifier;
   a second photodiode;
   a second amplifier connected to the second photodiode;
   a second ADC connected to an output of the second amplifier;
   a processor connected to an output of the first ADC and an output of the second ADC; and
   a direct-current-to-direct-current converter connected to an output of the processor and to the first photodiode and the second photodiode.

8. The lidar receiver of claim 7, wherein the first photodiode and the second photodiode are avalanche photodiodes.

9. The lidar receiver of claim 7, wherein at least one of the first amplifier or the second amplifier is a low speed amplifier.

10. The lidar receiver of claim 7, wherein the first photodiode is to generate a first analog signal,
    wherein the first amplifier is to obtain the first analog signal from the first photodiode,
    wherein the first ADC is to derive a first digital signal based on the first analog signal,
    wherein the second photodiode is to generate a second analog signal,
    wherein the second amplifier is to obtain the second analog signal from the second photodiode, and
    wherein the second ADC is to derive a second digital signal based on the second analog signal.

11. The lidar receiver of claim 7, wherein the processor is to determine, based on the output of the first ADC and the output of the second ADC, a first bias to apply to the first photodiode and a second bias to apply to the second photodiode,
    wherein, when the first bias is applied to the first photodiode and the second bias is applied to the second photodiode, a first current associated with the first photodiode corresponds to a second current associated with the second photodiode.

12. The lidar receiver of claim 11, wherein the first bias, when applied to the first photodiode, adjusts a first gain of the first photodiode, and
    wherein the second bias, when applied to the second photodiode, adjusts a second gain of the second photodiode.

13. The lidar receiver of claim 7, wherein the direct-current-to-direct-current converter is to apply, based on the output of the processor, a first bias to the first photodiode and to apply, based on the output of the processor, a second bias to the second photodiode.

14. The lidar receiver of claim 7, further comprising:
a transimpedance amplifier connected to the first photodiode and the second photodiode; and
a third ADC connected to the transimpedance amplifier.

15. The lidar receiver of claim 14, wherein the transimpedance amplifier is to convert a photocurrent to an analog output signal,
wherein the first photodiode and the second photodiode are to generate the photocurrent; and
wherein the third ADC is to convert the analog output signal to a digital output signal.

16. A method, comprising:
generating, by a lidar receiver, using a first photodiode, and based at least in part on a reflection of an optical beam, a first analog signal;
deriving, by the lidar receiver and based on the first analog signal, a first digital signal;
generating, by the lidar receiver, using a second photodiode, and based at least in part on the reflection of the optical beam, a second analog signal;
deriving, by the lidar receiver and based on the second analog signal, a second digital signal; and
determining, by the lidar receiver and based on the first digital signal and the second digital signal, a first bias to apply to the first photodiode and a second bias to apply to the second photodiode,
wherein, when the first bias is applied to the first photodiode and the second bias is applied to the second photodiode, a first current associated with the first analog signal corresponds to a second current associated with the second analog signal.

17. The method of claim 16, wherein the first photodiode and the second photodiode are avalanche photodiodes.

18. The method of claim 16, wherein the first bias, when applied to the first photodiode, adjusts a first gain of the first photodiode, and
wherein the second bias, when applied to the second photodiode, adjusts a second gain of the second photodiode.

19. The method of claim 16, further comprising:
applying the first bias to the first photodiode; and
applying the second bias to the second photodiode.

20. The method of claim 16, further comprising:
generating, using the first photodiode and the second photodiode, a photocurrent; and
converting the photocurrent to an output signal.

* * * * *